United States Patent [19]

Hama

[11] Patent Number: 4,700,463

[45] Date of Patent: Oct. 20, 1987

[54] NON-CRYSTALLINE SEMICONDUCTOR SOLAR BATTERY AND METHOD OF MANUFACTURE THEREOF

[75] Inventor: Toshio Hama, Kawasaki, Japan

[73] Assignee: Fuji Electric Company Ltd., Japan

[21] Appl. No.: 903,453

[22] Filed: Sep. 4, 1986

[30] Foreign Application Priority Data

Sep. 9, 1985 [JP] Japan .................................. 60-199114

[51] Int. Cl.$^4$ ............................................. H01L 31/18
[52] U.S. Cl. ......................................... 437/2; 136/258;
136/290; 437/181; 437/8; 437/174
[58] Field of Search ............... 136/256, 258 AM, 290;
357/30, 59 C; 29/572, 574, 575, 590

[56] References Cited

U.S. PATENT DOCUMENTS 4,451,970  6/1984  Izu et al. .................................. 29/574

FOREIGN PATENT DOCUMENTS 59-35490  2/1984  Japan ..................................... 136/290
59-86269  5/1984  Japan ..................................... 136/290
59-107579  6/1984  Japan ..................................... 136/290
60-85578  5/1985  Japan ..................................... 136/290

Primary Examiner—Aaron Weisstuch
Attorney, Agent, or Firm—Stevens, Davis, Miller & Mosher

[57] ABSTRACT

The invention involves (1) forming a transparent conductive film on an insulating transparent substrate, with the transparent conductive film defining a first electrode, (2) forming a non-crystalline semiconductor film on the transparent conductive film, (3) detecting any pinholes existing in the non-crystalline semiconductor film, (4) applying a laser beam in a reducing atmosphere through the detected pinholes to portions of the transparent conductive film located at portions of the pinholes, such that the portions of the transparent conductive film located at positions at which the pinholes are present are caused to have a high resistance by reduction, and (5) finally forming a metal film on the non-crystalline semiconductor film to define a second electrode.

12 Claims, 4 Drawing Figures

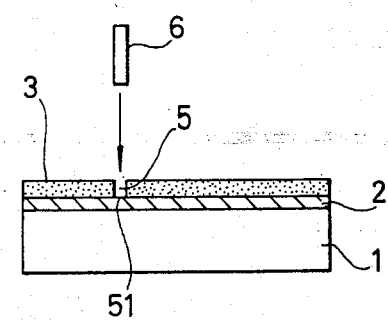
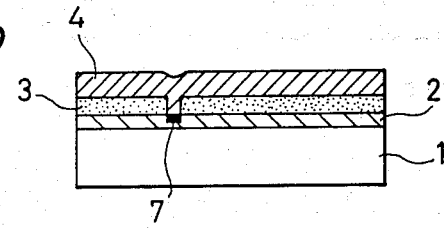
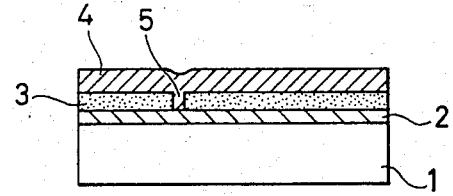
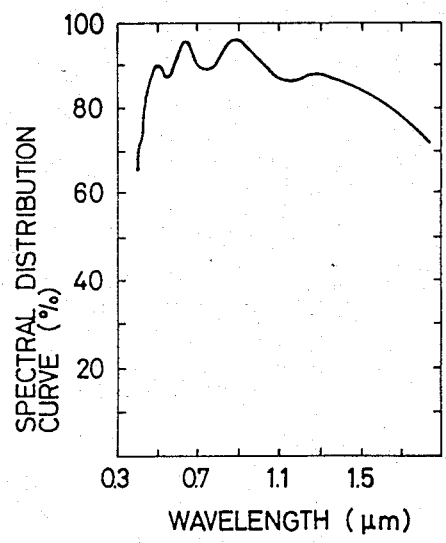

4,700,463

NON-CRYSTALLINE SEMICONDUCTOR SOLAR BATTERY AND METHOD OF MANUFACTURE THEREOF

BACKGROUND OF THE INVENTION

1. Field of the Invention

This invention relates to non-crystalline semiconductor solar batteries and methods of manufacture thereof; more particularly, the batteries are non-crystalline semiconductor solar cells of the type including (1) a transparent conductive film formed on an insulated transparent substrate, with the transparent conductive film defining a first electrode, (2) a non-crystalline semiconductor film formed on the transparent conductive film, and (3) a metal film formed on the non-crystalline semiconductor film, with the metal film defining a second electrode.

2. Discussion of the Prior Art

Recently, a type of non-crystalline semiconductor solar battery has become well known as a low cost solar battery, in which photo-electric conversion is carried out by a non-crystalline silicon (hereinafter referred to as "a-Si," when applicable) film which is made from mono-silane or the like, by plasma chemical vapor deposition (CVD). The non-crystalline semiconductor solar battery can be formed to have a large area and therefore it is expected that it will be used for electric power generation.

FIG. 2 shows the structure of one example of an a-Si solar battery. The solar battery comprises an insulated transparent substrate, namely, a glass substrate 1, a transparent conductive film 2 of $SnO_2$ or ITO (indium tin oxide) formed on glass substrate 1, an a-Si film 3 having a pin junction formed on transparent conductive film 2, and a metal film 4 formed on a-Si film 3. If, in the formation of a-Si film 3, the a-Si does not sufficiently adhere to transparent conductive film 2, pinholes 5 are formed. It is theorized that the a-Si does not sufficiently adhere to transparent conductive film 2 because of the surface condition or smudges of transparent conductive film 2. In manufacturing large-area solar batteries, the probability of formation of pinholes 5 is high. When the metal film formed on a-Si film 3 enters pinholes 5, the metal film 4 is electrically connected to the transparent conductive film 2, as a result of which the characteristic of the solar battery is lowered and the manufacturing yield of the solar battery is decreased correspondingly. In order to overcome the above-described difficulty, a method has been developed, as disclosed in Japanese Patent Application No. 77263/1973 (open for public inspection), in which, after a-Si film 3 has been formed, pinholes 5 are filled with insulating material. However, filling pinholes 5 with insulating material is troublesome and increases the manufacturing cost. In another method developed to overcome the above-described difficulty, a photo-etching technique is utilized to coat a-Si film 3 with photo-resist, and the photo-resist, except for that in pinholes 5, is removed by exposing and developing. However, this latter method is still disadvantageous in that a-Si film 3 may be damaged when the resist layer is peeled off the a-Si film 3 and also the metal film does not sufficiently adhere to the a-Si film because of the resist residue remaining on the film.

SUMMARY OF THE INVENTION

Accordingly, an object of this invention is to overcome the above-described difficulties accompanying the conventional methods of manufacturing non-crystalline semiconductor solar batteries. More specifically, an object of the invention is to provide a method of manufacturing a non-crystalline semiconductor solar battery in which short-circuiting of the metal film with the transparent conductive film through pinholes formed in the non-crystalline semiconductor film is efficiently and automatically prevented without damaging the non-crystalline semiconductor film.

According to the invention, after the non-crystalline semiconductor film is formed on the transparent conductive layer, the pinholes formed in the non-crystalline semiconductor film are detected, and the resistance of portions of the transparent conductive layer located at positions below or adjacent the pinholes is increased, by, for example, applying a laser beam in a reducing atmosphere through the pinholes to the parts of the transparent conductive film which correspond to the bottoms of the pinholes, so that these parts of the transparent conductive film are caused to have a high resistance by reduction. As a result, even if the pinholes are filled with metal when the metal film is formed on the non-crystalline semiconductor film the short-circuiting mentioned above is effectively prevented. Preferably, the laser beam matches the light absorbing characteristic of the transparent conductive film. A ruby laser, Nd:YAG (yttrium-aluminum-garnet) laser, He-Ne laser, $CO_2$ laser, or GaAlAs laser, which is a semiconductor laser, can be employed as a long wavelength laser. A He-Cd laser or $N_2$ laser may be used as a short wavelength laser.

Also according to the invention, the detection step can comprise applying monochromatic light to the non-crystalline semiconductor film such that the light passes through the non-crystalline semiconducor film, the transparent conductive film, and the insulating transparent substrate, and measuring the intensity of the light after it has passed through the insulating transparent substrate to detect bright spots in the light. The detection step can further comprise employing a photosensor in close contact with a surface of the insulating transparent substrate to detect and measure the light after it has passed through the insulating transparent substrate to generate signals representing the bright spots. The laser beam can be automatically applied responsive to the signals generated by the photosensor. The laser beam can be applied in a hydrogen atmosphere and the detection step can be performed in an enclosure having a reduced pressure.

Also according to the invention, a non-crystalline semiconductor solar battery is provided. The battery comprises an insulating transparent substrate, a transparent conductive film formed on the substrate, with the transparent conductive film defining a first electrode, and a non-crystalline semiconductor film formed on the transparent conductive film. The transparent conductive film includes high resistance portions located at positions below pinholes present in the non-crystalline semiconductor film. A metal film is formed on the non-crystalline semiconductor film, with the metal film defining a second electrode.

BRIEF DESCRIPTION OF THE DRAWINGS

The above and other objects, advantages and features of the present invention will be more fully understood when considered in conjunction with the following figures, of which:

FIGS. 1a and 1b are sectional views showing essential manufacturing steps of a method of manufacturing a non-crystalline semiconductor solar battery according to one embodiment of this invention;

FIG. 2 is a sectional view of a conventional non-crystalline semiconductor solar battery; and FIG. 3 is a graphical representation indicating the spectral distribution curve of transmittance of $SnO_2$.

DETAILED DESCRIPTION OF THE INVENTION

FIGS. 1a and 1b show the manufacturing steps of a method of manufacturing a non-crystalline semiconductor solar battery according to one embodiment of the invention. In FIG. 1, parts corresponding functionally to those already described with reference to FIG. 2 are therefore designated by like reference numerals.

An $SnO_2$ film 2 having a sheet resistance of 20 to 50 ohms/cm$^2$ is formed on a glass substrate 10×10 cm$^2$ by vacuum deposition or sputtering. Preferably, $SnO_2$ film 2 has a thickness of 2000 to 5000 Å. An a-Si film 3 having a thickness of 3000 to 9000 Å is formed on $SnO_2$ film 2 by plasma CVD. Then, pinholes 5 are detected by a method in which monochromatic light having a wavelength of 4000 to 6000 Å is applied to a-Si film 3 from above, and the intensity of light which passes therethrough is measured under glass substrate 1 to detect bright spots. The sizes of pinholes 5 range from several microns to several hundreds of microns. The pinholes can be automatically detected with a photosensor set in close contact with the lower surface of glass substrate 1.

Substrate 1 on which a-Si film 3 has been formed is placed in a hydrogen atmosphere under a pressure of 0.1 to 20 Pa, and a laser beam, having a laser power 0.1 to 3 W, of an Nd:YAG laser 6 is applied to pinholes 5 for $10^{-6}$ to $10^{-8}$ second. The spectral distribution curve of the transmittance of $SnO_2$ is shown in FIG. 3. As is apparent from FIG. 3, light absorption is higher on the long wavelength side. Therefore, the temperature of transparent conductive film 2 on bottom 51 of each pinhole 5 is locally increased by application of the Nd:YAG laser beam to 500° to 700° C. As a result, reduction of $SnO_2$ by hydrogen is effected to form SnO, and the sheet resistance of part 7 of transparent conductive film 2 (FIG. 1b) is increased to 1000 ohms or higher. Therefore, when a metal electrode 4 of aluminum or silver is formed on a-Si film 3 by vacuum deposition, the deterioration of he characteristic of the solar battery due to short-circuiting at pinholes 5 can be prevented because part 7 of transparent conductive film 2, which the metal in pinhole 5 contacts, has been caused to have a high resistance as described above. The electrical characteristics of a solar battery manufactured by forming a metal film 4 on a-Si film 3 having pinholes 5 without applying the laser beam were 0.54 V in open circuit voltage, 12.4 mA/cm$^2$ in current density, and 0.31 in fill factor. On the other hand, a solar battery on the same lot which was subjected to laser treatment according to the invention showed excellent electrical characteristics, i.e., 0.80 V in open circuit voltage, 12.5 mA/cm$^2$ in current density and 0.62 in fill factor, thus being considerably more effective as a solar battery. Because laser treatment in a hydrogen atmosphere is one of the components of a-Si film, it will not adversely affect the film quality.

The application of the laser beam can be automatically performed according to results of automatic pinhole detection which is carried out with a photosensor. The pinhole detection may be carried out in a pressure-reduced device.

In the non-crystalline semiconductor solar battery manufacturing method of the invention, the non-crystalline semiconductor film is formed on the transparent conductive film, which in turn has been formed on the insulated transparent substrate, with the transparent conductive film defining one electrode. The pinholes in the non-crystalline semiconductor film are detected, and a laser beam is applied to the insulated transparent substrate, on which the non-crystalline semiconductor film has been formed, in a reducing atmosphere, so that the parts of the transparent conductive film which correspond to the bottoms of the pinholes are caused to have a high resistance by reduction. Therefore, when the metal film, which defines the other electrode, is formed on the non-crystalline semiconductor film, the metal film is not short-circuited with the transparent conductive film. In other words, the invention overcomes the difficulty associated with the prior art wherein the characteristics of the solar battery are diminished due to the short-circuiting of the metal film with the transparent conductive film through the pinholes. The detection of the pinholes and the application of the laser beam can be readily automated. Since the device for applying the laser beam in the reducing atmosphere is substantially equal in size to the device for forming the non-crystalline semiconductor film, an in-line system may be employed therefor. As is apparent from the above description, the method of the invention is considerably effective in increasing the yield of manufacture of non-crystalline semiconductor solar batteries and in decreasing manufacturing costs.

The above description and the accompanying drawings are merely illustrative of the application of the principles of the present invention and are not limiting. Numerous other arrangements which embody the principles of the invention and which fall within its spirit and scope may be readily devised by those skilled in the art. Accordingly, the invention is not limited by the foregoing description, but is only limited by the scope of the appended claims.

I claim:

1. A method of manufacturing a non-crystalline semiconductor solar battery, comprising:
    (a) forming a transparent conductive film on an insulating transparent substrate, said transparent conductive film defining a first electrode;
    (b) forming a non-crystalline semiconductor film on said transparent conductive film;
    (c) detecting pinholes existing in said non-crystalline semiconductor film;
    (d) applying a laser beam in a reducing atmosphere through pinholes detected in step (c) to portions of said transparent conductive film located at positions of said pinholes such that said portions of said transparent conductive film are caused to have a high resistance by reduction, and
    (e) forming a metal film on said non-crystalline semiconductor film, said metal film defining a second electrode.

2. The method as in claim 1, wherein said laser beam matches the light absorbance characteristics of said transparent conductive film.

3. The method as in claim 1, wherein step (c) comprises (i) applying monocromatic light to said non-crystalline semiconductor film such that said light passes through said non-crystalline semiconductor film, said transparent conductive film and said insulating transparent substrate, and (ii) measuring the intensity of said light after it has passed through said insulating transparent substrate to detect bright spots in said light.

4. The method as in claim 3, wherein step (c) further comprises employing a photosensor in close contact with a surface of said insulating transparent substrate to detect and measure said light after it has passed through said insulating transparent substrate to generate signals representing said bright spots.

5. The method as in claim 4, wherein step (d) comprises automatically applying said laser beam responsive to said signals generated by said photosensor.

6. The method as in claim 1, wherein said laser beam comprises a long wavelength beam.

7. The method as in claim 1, wherein said laser beam comprises a short wavelength beam.

8. The method as in claim 6, wherein said laser beam is generated by a laser comprising one of a ruby laser, a Nd:YAG laser, a He-Ne laser, a $CO_2$ laser, and a GaAlAs laser.

9. The method as in claim 7, wherein said laser beam is generated by a laser comprising one of an He-Cd laser and an $N_2$ laser.

10. The method as in claim 1, wherein said laser beam is applied in a hydrogen atmosphere.

11. The method as in claim 1, wherein step (c) is performed in an enclosure having a reduced pressure.

12. A method of manufacturing a non-crystalline semiconductor solar battery, comprising:

(a) forming a transparent conductive film on an insulating transparent glass substrate, said transparent conductive film defining a first electrode;

(b) forming a non-crystalline semiconductor film on said transparent conductive film;

(c) detecting pinholes existing in said non-crystalline semiconductive film by (i) applying monochromatic light to said non-crystalline semiconductive film such that said light passes through said non-crystalline semiconductive film, said transparent conductive film, and said insulating transparent substrate, and (ii) employing a photosensor disposed in close contact with a surface of said insulating transparent substrate to detect and measure said light after it has passed through said insulating transparent substrate and to generate signals representing bright spots in said light, (d) applying a laser beam in a reducing atmosphere comprising hydrogen through pinholes detected in step (c) to portions of said transparent conductive film located at positions of said pinholes such that said portions of said transparent conductive film are caused to have a high resistance by reduction, said laser beam matching the light absorbance characteristics of said transparent conductive film, said laser beam being automatically applied responsive to said signals generated by said photosensor, and (e) forming a metal film on said non-crystalline semiconductor film, said metal film comprising a second electrode.

* * * * *